US012603614B2

(12) United States Patent
Rafi

(10) Patent No.: US 12,603,614 B2
(45) Date of Patent: Apr. 14, 2026

(54) WIDEBAND DOHERTY POWER AMPLIFIER

(71) Applicant: Silicon Laboratories Inc., Austin, TX (US)

(72) Inventor: Aslamali A. Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 589 days.

(21) Appl. No.: 18/063,699

(22) Filed: Dec. 9, 2022

(65) Prior Publication Data

US 2024/0195362 A1    Jun. 13, 2024

(51) Int. Cl.
| | |
|---|---|
| H03F 1/02 | (2006.01) |
| H03F 3/195 | (2006.01) |
| H03F 3/24 | (2006.01) |
| H04B 1/04 | (2006.01) |

(52) U.S. Cl.
CPC ......... H03F 1/0288 (2013.01); H03F 1/0227 (2013.01); H03F 3/195 (2013.01); H03F 3/245 (2013.01); H04B 1/0458 (2013.01); H03F 2200/451 (2013.01); H03F 2200/541 (2013.01); H04B 2001/0408 (2013.01)

(58) Field of Classification Search
CPC ...... H03F 1/0288; H03F 1/0227; H03F 3/195; H03F 3/245; H03F 2200/451; H03F 2200/541; H04B 1/0458; H04B 2001/0408
USPC ...................................................... 330/124 R
See application file for complete search history.

(56) References Cited

U.S. PATENT DOCUMENTS

| | | | |
|---|---|---|---|
| 10,338,646 B1 | 7/2019 | Vilhonen | |
| 11,190,147 B1 | 11/2021 | Koroglu | |
| 2010/0148866 A1* | 6/2010 | Lee .......................... | H03F 3/211 |
| | | | 29/605 |
| 2016/0149543 A1* | 5/2016 | Anderson ............... | H01F 27/29 |
| | | | 330/307 |
| 2018/0019711 A1 | 1/2018 | Wang | |
| 2018/0358930 A1 | 12/2018 | Haine | |
| 2020/0144976 A1* | 5/2020 | Dasgupta ................ | H03F 3/604 |
| 2021/0175865 A1* | 6/2021 | Lee ......................... | H03F 1/0288 |
| 2021/0399701 A1* | 12/2021 | Honda .................... | H03F 3/195 |
| 2022/0182472 A1* | 6/2022 | Tomita ...................... | H03F 1/07 |
| 2023/0246596 A1* | 8/2023 | Khlat .................... | H03F 1/0261 |
| | | | 330/124 R |
| 2024/0106396 A1* | 3/2024 | Beikmirza ............ | H03F 3/3001 |

(Continued)

OTHER PUBLICATIONS

Yuen Hui Chee et al., "A Digitally Assisted CMOS WiFi 802.11ac/ 11ax Front-End Module Achieving 12% PA Efficiency at 20dBm Output Power with 160 MHz 256-QAM OFDM Signal," ISSCC 2017, Feb. 7, 2017, 2017 IEEE Intl. Solid-State Circuits Conference, pp. 292-294.

(Continued)

*Primary Examiner* — Hafizur Rahman
(74) *Attorney, Agent, or Firm* — Trop, Pruner & Hu, P.C.

(57) ABSTRACT

In on example, an apparatus includes: a first power amplifier (PA) to receive a first input radio frequency (RF) signal and output a first amplified RF signal; a second PA to receive a second input RF signal and output a second amplified RF signal; and a transformer circuit coupled to an output of the first PA and an output of the second PA. The transformer circuit is to provide, to a load circuit, an RF output signal comprising the first amplified RF signal and the second amplified RF signal.

18 Claims, 9 Drawing Sheets

(56)                    References Cited

U.S. PATENT DOCUMENTS

2024/0187033 A1 *    6/2024    Shounai ..................... H03F 3/24
2025/0062731 A1 *    2/2025    Lee ........................... H03F 3/72

OTHER PUBLICATIONS

W.H. Doherty, "A New High Efficiency Power Amplifier for Modulated Waves," Proceedings of the Institute of Radio Engineers, vol. 24, No. 9, Sep. 1936, pp. 1163-1182.
Peter Aldi et al., "A 5.8 GHz 1 V Linear Power Amplifier Using a Novel On-Chip Transformer Power Combiner in Standard 90 nm CMOS," IEEE Journal of Solid-State Circuits, vol. 43, No. 5, May 2008, pp. 1054-1063.
Morteza S. Alavi, et al., "A Wideband 2×13-bit All-Digital I/Q RF-DAC," IEEE Transactions on Microwave Theory and Techniques, vol. 62, No. 4, Apr. 2014, pp. 732-752.
Ercan Kaymaksut, et al., "CMOS Transformer-Based Uneven Doherty Power Amplifier for WLAN Applications," 2011, 4 pages total.
Ercan Kaymaksut, et al., "Transformer-Based Uneven Doherty Power Amplifier in 90 nm CMOS for WLAN Applications," IEEE Journal of Solid-State Circuits, vol. 47, No. 7, Jul. 2012, 13 pages total.
Song Hu, et al. "28/37/39GHz Multiband Linear Doherty Power Amplifier in Silicon for 5G Applications," 2019, 12 pages total.

* cited by examiner

101

102

500

Start

510  In first PA, amplify and output first differential RF signal

520  In second PA, amplify and output second differential RF signal

530  Transform first amplified differential RF signal to provide first output RF signal to load circuit 540  Transform second amplified differential RF signal to provide second output RF signal to load circuit

WIDEBAND DOHERTY POWER AMPLIFIER

BACKGROUND

As wireless communication becomes more prevalent, a 2.4 gigahertz (GHz) spectrum becomes more crowded. As a result, some wireless protocols expand to higher frequency bands, notably 5 GHz and 6 GHz bands. Compared to the 2.4 GHz Industrial Scientific Medical (ISM) band which has a bandwidth of about 100 megahertz (MHz), the 5 GHz and 6 GHz bands extend over a GHz of bandwidth.

Furthermore, Wi-Fi uses orthogonal frequency division multiplexing (OFDM) modulation, which has a high peak to average power ratio. Conventional linear power amplifiers are backed off significantly from their peak power in order to accommodate the huge signal excursions, leading to very poor efficiency and consuming a high amount of current to achieve a given output power.

Thus some wireless systems include a transmitter having a Doherty power amplifier. A Doherty power amplifier includes separate amplifiers, where a first amplifier is active at levels lower than a saturation operating level. Then a second power amplifier contributes to the output power at higher levels, increasing efficiency. In addition, the Doherty power amplifier implements a quarter wave transmission line. However, this transmission line retains its quarter wave property at a single frequency and thus is unsuitable for wideband operation.

SUMMARY OF THE INVENTION

In one aspect, an apparatus comprises: a first power amplifier (PA) to receive a first input radio frequency (RF) signal and output a first amplified RF signal; a second PA to receive a second input RF signal and output a second amplified RF signal; and a transformer circuit coupled to an output of the first PA and an output of the second PA. The transformer circuit is to provide, to a load circuit, an RF output signal comprising the first amplified RF signal and the second amplified RF signal.

In one implementation, the transformer circuit comprises: a first primary winding coupled to the output of the first PA and a first secondary winding inductively coupled to the first primary winding to provide the first amplified RF signal to the load circuit; and a second primary winding coupled to the output of the second PA and a second secondary winding inductively coupled to the second primary winding to provide the second amplified RF signal to the load circuit.

In an implementation, the transformer circuit comprises at least one planar transformer. The at least one planar transformer may include: a first winding having a proximal portion and a distal portion, the proximal portion adjacent an opening; a first conductor coupled to an interior of the proximal portion and to provide the first amplified RF signal; and a second conductor coupled to an exterior of the proximal portion and to provide a supply voltage. The first conductor may have a first width and the second conductor may have a second width, the second width greater than the first width. The supply voltage provided via the second conductor may be less than a first supply voltage provided to the first PA.

In an implementation, the first PA comprises a main PA and the second PA comprises an auxiliary PA. The main PA can be configured to operate as a Class AB device and the auxiliary PA configured to operate as a Class C device. The transformer circuit may include a 2:1 ratio between a primary side and a secondary side, the transformer circuit comprising a quarter wavelength transmission line, the quarter wavelength transmission line comprising a matched transmission line. The quarter wavelength transmission line may have a 1× impedance transformation in a backoff region. The PA formed of the first and second PAs may operate over a wideband of at least 2.0 gigahertz.

In an implementation: the first PA is to output a first output current that varies based on the input voltage according to a first slope; and the second PA is to output a second output current that varies based on the input voltage according to a second slope, the second slope different than the first slope. Via the transformer circuit, the load circuit is to receive the first output current and a transformed second output current that varies based on the input voltage according to the first slope, the transformed second output current based on the second output current.

In one or more implementations, the apparatus further comprises a dynamic bias circuit to provide a dynamic bias voltage to the second PA, based at least in part on an output voltage of the first PA. The apparatus may further comprise a scaling circuit to scale an input to at least one of the first PA or the second PA.

In another aspect, a method includes: amplifying, in a first PA, a first differential RF signal and outputting a first amplified differential RF signal; amplifying, in a second PA, a second differential RF signal and outputting a second amplified differential RF signal; transforming, in a first transformer coupled to the first PA, the first amplified differential RF signal to provide a first output RF signal to a load circuit, the first transformer comprising a matched transmission line; and transforming, in a second transformer coupled to the second PA, the second amplified differential RF signal to provide a second output RF signal to the load circuit.

In an implementation, the method further comprises dynamically biasing the second PA based at least in part on the first differential RF signal. The method also may include amplifying, in the first PA and the second PA, a plurality of differential RF signals over a bandwidth of at least 2.0 gigahertz.

In yet another implementation, a transmitter has a signal processing path comprising: a digital baseband circuit to process data and output digital data; a converter to convert the digital data to analog data; at least one complex mixer to upconvert the analog data to quadrature RF signals; a first PA coupled to the at least one complex mixer to receive a first quadrature RF signal and output a first amplified quadrature RF signal; a second PA coupled to the at least one complex mixer to receive a second quadrature RF signal and output a second amplified quadrature RF signal; and a transformer circuit coupled to an output of the first PA and an output of the second PA. The transformer circuit is to provide, to a load circuit, an RF output signal comprising the first amplified quadrature RF signal and the second amplified quadrature RF signal.

In an implementation, the transformer circuit comprises: a first primary winding coupled to the output of the first PA and a first secondary winding inductively coupled to the first primary winding to provide the first amplified quadrature RF signal to the load circuit; and a second primary winding coupled to the output of the second PA and a second secondary winding inductively coupled to the second primary winding to provide the second amplified quadrature RF signal to the load circuit.

DETAILED DESCRIPTION

In various embodiments, a Doherty power amplifier may be configured to operate at wide bands, yet still retain the efficiency of a Doherty amplifier. To this end, embodiments provide a circuit configuration in which a transformer is coupled to an auxiliary power amplifier (PA) of the Doherty power amplifier. This transformer may provide a matched transmission line, namely a quarter wave transmission line that is matched in a backoff region.

Although not limited in this regard, a wideband power amplifier in accordance with an embodiment may be used in 5G and 6G implementations that operate over a wide frequency range, e.g., approximately 4.9 gigahertz (GHz) to 7.125 GHZ, providing a 1.45× range from the low frequency end to the high frequency end.

Figure 1A:
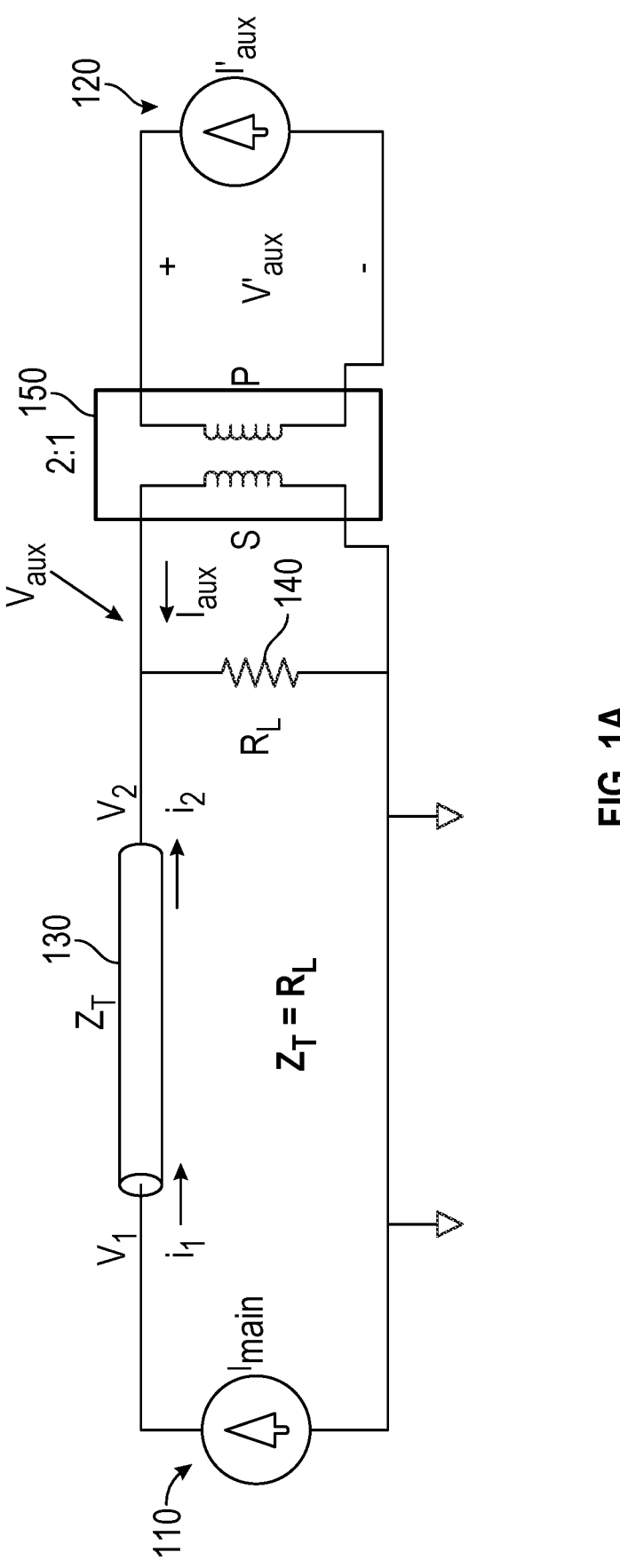
FIG. 1A is a generic schematic diagram of a theoretical Doherty power amplifier in accordance with an embodiment.

Referring now to FIG. 1A, shown is a generic schematic diagram of a theoretical Doherty power amplifier in accordance with an embodiment. As shown in FIG. 1A, power amplifier 100 includes a main current source 110 that provides a main current $I_{main}$, and an auxiliary current source 120 that provides an auxiliary current $I_{aux}$. Although not limited in this aspect, current sources 110, 120 may be implemented using one or more metal oxide semiconductor field effect transistors (MOSFETs).

Still with reference to FIG. 1A, a matched transmission line 130 couples serially between current source 110 and current source 120. By providing a matched transmission line, there is no variation with respect to frequency, in contrast to a conventional quarter wavelength transmission line that peaks in a backoff region, and falls off from there. Stated another way, transmission line 130 has an impedance transformation ratio of 1 of the transmission line impedance ($Z_T$) with respect to a load impedance ($R_L$) (i.e., $Z_T=R_L$). This stands in contrast to a conventional Doherty power amplifier, which has an unmatched transmission line and an impedance transformation ratio of 4×. A load circuit 140, implemented as a load resistance ($R_L$), couples in parallel with a transformer 150. Transmission line 130 may have an impedance equal to an impedance of load circuit 140, i.e., $Z_T=R_L$, across a wideband range of frequency operation.

Still referring to FIG. 1A, transformer 150 is represented with a primary winding P coupled in parallel with auxiliary current source 120 and a secondary winding S coupled in parallel with load circuit 140. In an embodiment, transformer 150 may be implemented as a 2:1 transformer. By providing a 2:1 transformation, a reduced voltage may be realized on an active side of auxiliary current source 120

($V'_{aux}=V_{aux}/2$). While a 2:1 ratio may be preferred for one or more embodiments, in other embodiments a transformer may be provided that has a ratio that is substantially around 2:1 (e.g., between approximately 1.8 to 2.2).

Figure 1B:
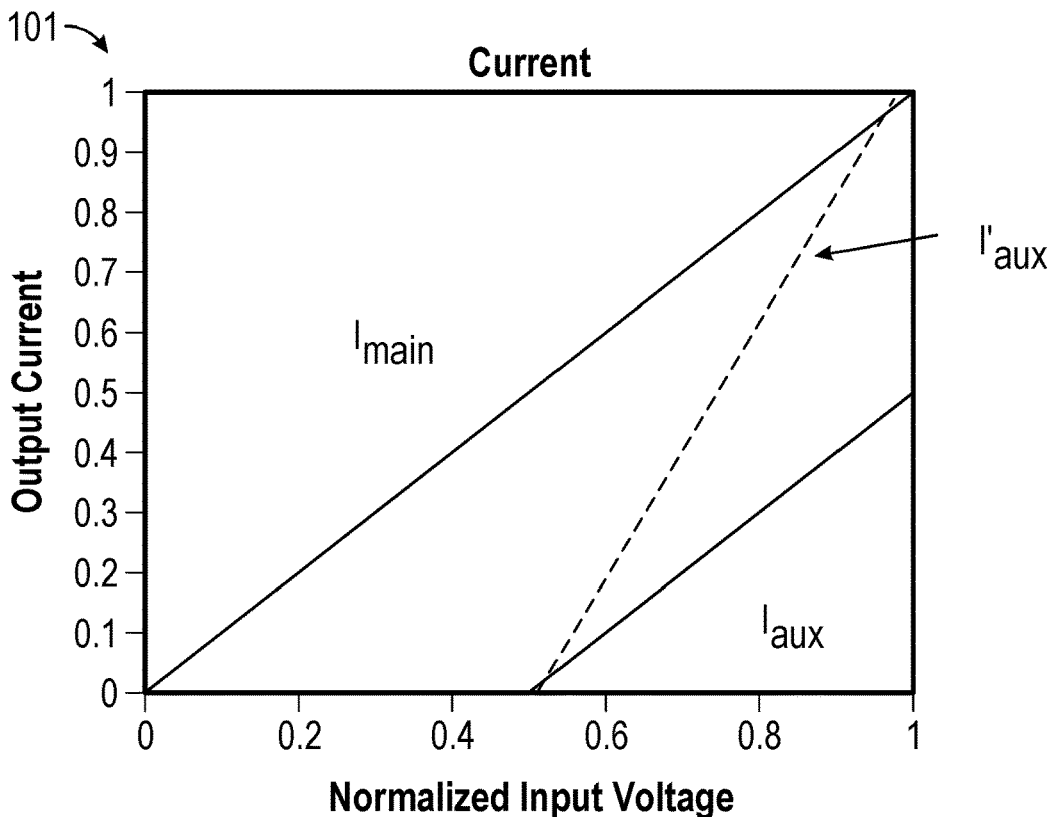
FIGS. 1B and 1C are graphical illustrations of output current as a function of a normalized input voltage and output voltage as a function of the normalized input voltage.
Figure 1C:
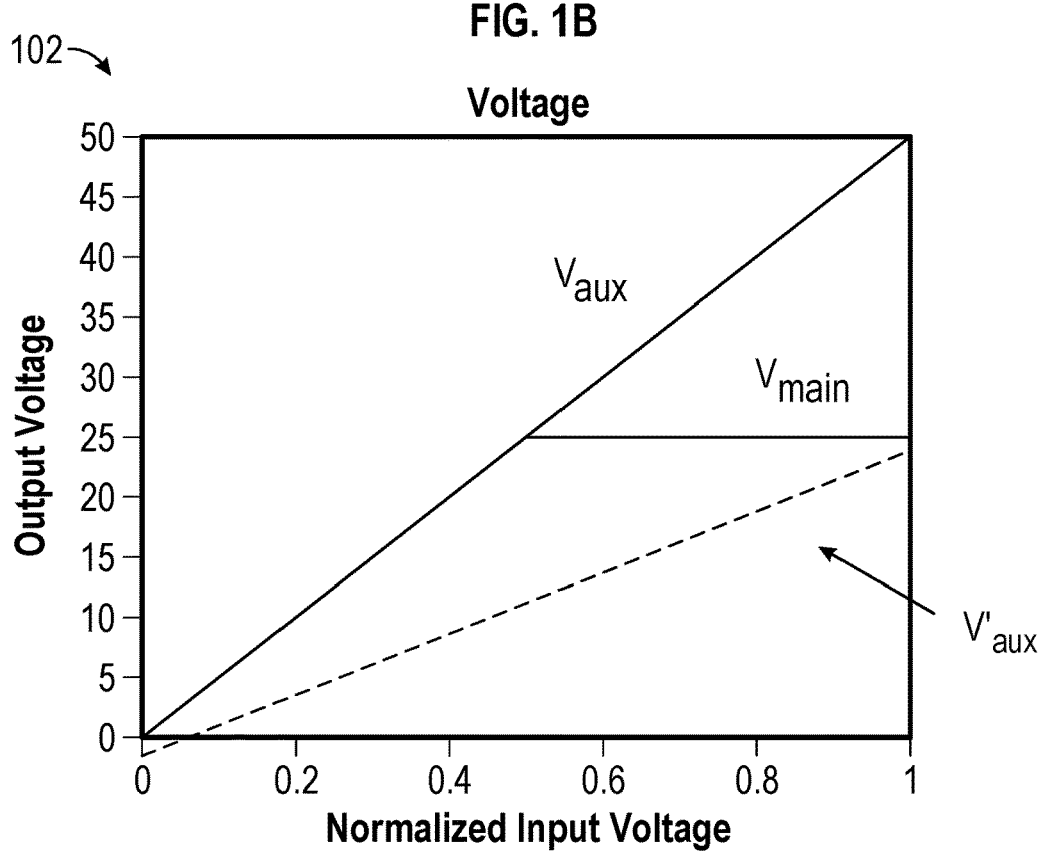

Referring now to FIGS. 1B and 1C, shown are graphical illustrations of output current as a function of a normalized input voltage and output voltage as a function of the normalized input voltage, respectively. As shown in FIG. 1B, in illustration 101 main and auxiliary currents (as provided to the load circuit) have a common slope, with the main current ($I_{main}$) increasing linearly over the entire normalized input voltage range, while the auxiliary current provided to the load circuit ($I_{aux}$) increases linearly once a threshold voltage (namely a normalized input voltage of 0.5) is reached. In FIG. 1B, the auxiliary current of the auxiliary power amplifier ($I'_{aux}$) has a different and steeper slope owing to the transformation.

In illustration 102 of FIG. 1C, the output voltage is provided from the main power amplifier ($V_{main}$) until the threshold normalizes (the threshold voltage is reached), and the main output voltage saturates. At this point, the voltage contribution of the auxiliary power amplifier ($V_{aux}$) increases such that at a maximum normalized input voltage, a maximum output voltage is reached. Note also in FIG. 1C that a voltage across a primary side of transformer 150 (and auxiliary current source 120) ($V'_{aux}$) actually increases at a different (and smaller) slope than the output voltage of main current source 110.

Figure 1D:
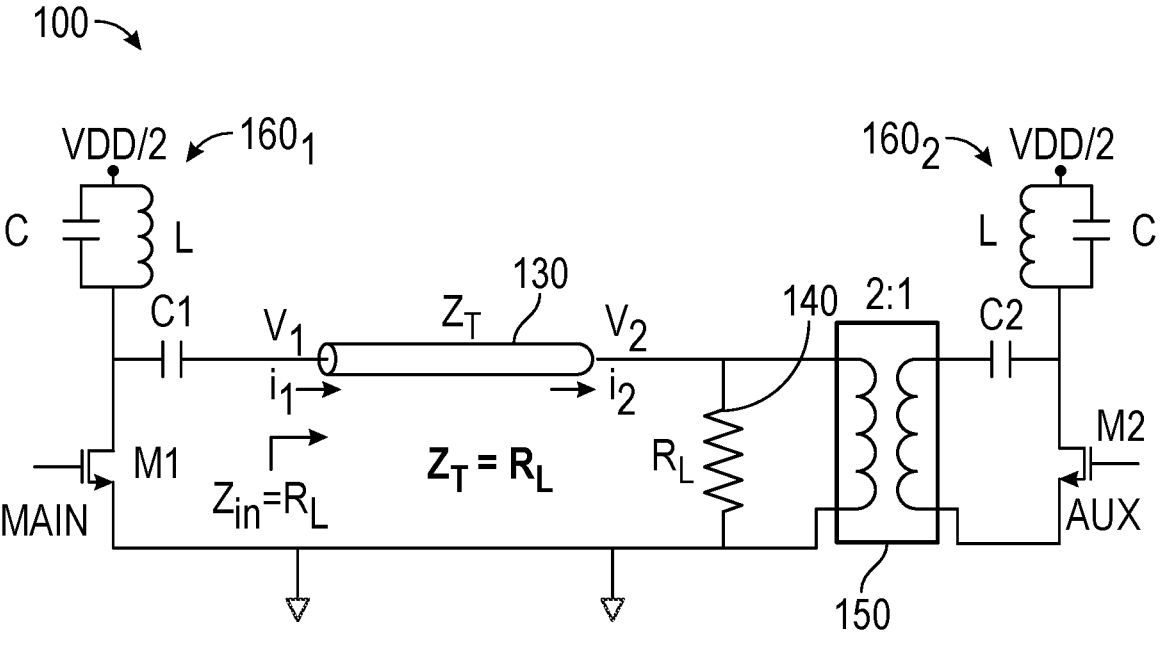
FIG. 1D is schematic diagram of a Doherty power amplifier in accordance with an embodiment.

Referring now to FIG. 1D, shown is a more detailed schematic diagram of a Doherty power amplifier in accordance with an embodiment. As shown in FIG. 1D, amplifier 100 is illustrated in further detail. More specifically as shown, the main and auxiliary PAs are shown schematically as power MOSFETs M1, M2 (shown as N-channel MOSFETs (NMOS)). In addition, power sources are shown coupled to source terminals of NMOS devices M1, M2. More particularly as shown, choke circuits 160₁, 160₂ couple to the source terminals. Choke circuits 160 may be implemented as LC filters having a node coupled to receive a supply voltage of VDD/2. Note that this supply voltage is intended to represent a supply voltage level that may be lower than that required by a conventional Doherty PA. As a result, smaller, core MOSFETs may be used. Although shown at a supply voltage value of VDD/2 to illustrate this property, understand that as implemented in a particular semiconductor die, a given supply voltage (at a level of VDD) may be used, such as a 3.0 volt supply as provided by a battery.

As further shown in FIG. 1D, the source terminals of MOSFETs M1, M2 couple to transmission line 130 and transformer 150, respectively, via coupling capacitors C1, C2. In other aspects, the schematic of FIG. 1D tracks that of FIG. 1A. With this implementation, a high frequency wideband Doherty PA is provided that can output the same power as a conventional Doherty PA with a lower supply voltage, while using scaling friendly core devices. In addition, by using a matched transmission line having an 1× impedance transformation ratio, lower losses and less frequency sensitivity inhere.

Figure 2:
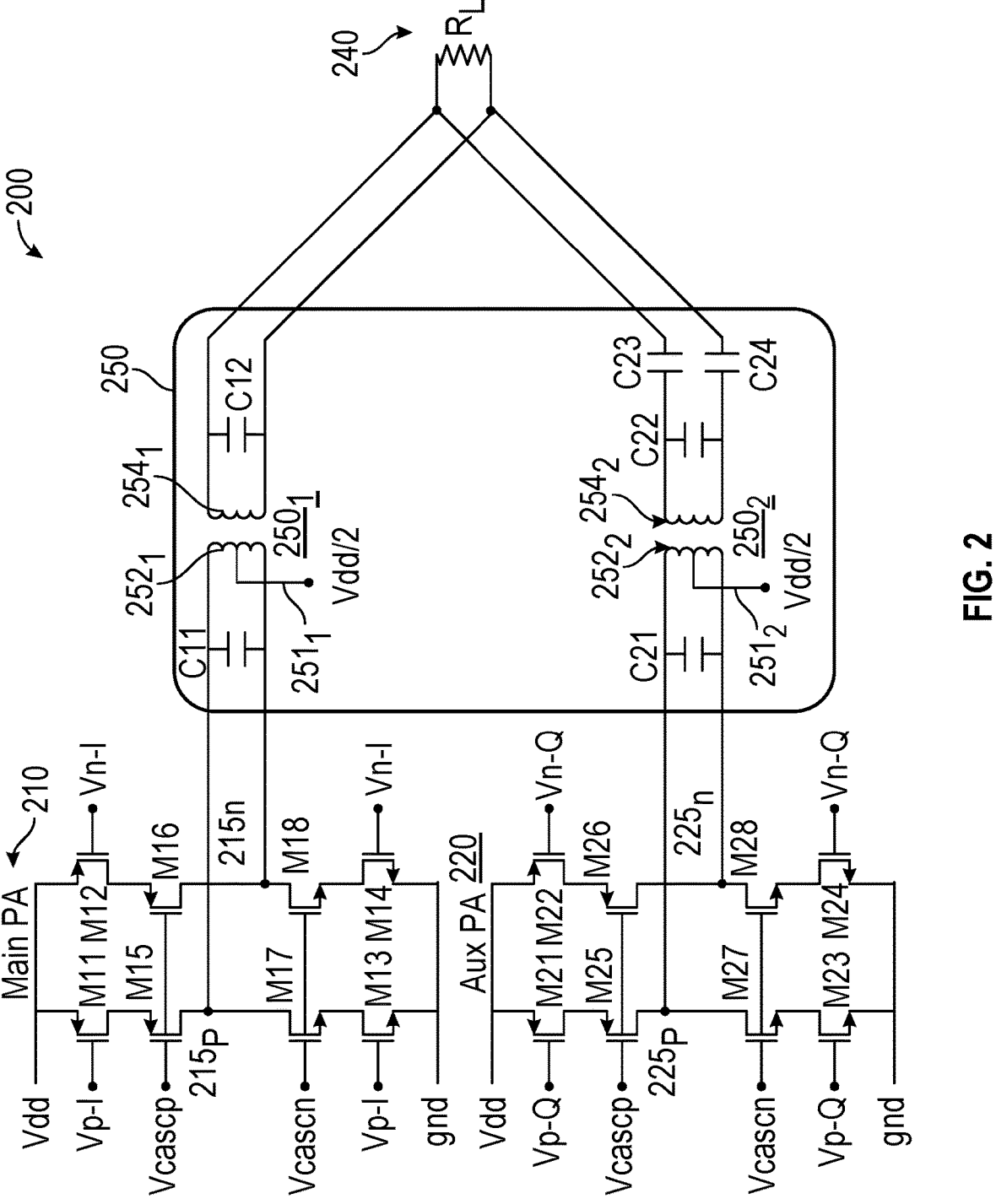
FIG. 2 is detailed schematic diagram of a Doherty power amplifier in accordance with an embodiment.

Referring now to FIG. 2, shown is a more detailed schematic diagram of a Doherty power amplifier in accordance with an embodiment. As shown in FIG. 2, amplifier 200 is implemented with a CMOS arrangement. In other implementations, a pure NMOS implementation is possible also. Using a CMOS implementation as in FIG. 2, a higher VDD may be realized for the overall PA, avoiding a voltage converter such as a DC-DC converter to provide a voltage of VDD/2.

First with reference to a main PA 210, a differential implementation is provided with positive and negative in-phase (I) voltage signals being provided to corresponding input P-channel (PMOS) devices M11, M12 and NMOS devices M13, M14. As further illustrated, cascode devices M15-18 couple between corresponding input devices M11-M14 and output nodes $215_{p, n}$.

Auxiliary PA 220 may be similarly configured. More specifically as shown, positive and negative quadrature-phase (Q) voltage signals are provided to corresponding input PMOS devices M21, M22 and NMOS devices M23, M24. As further illustrated, cascode devices M25-28 couple between corresponding input devices M21-M24 and output nodes $225_{p, n}$.

As further shown in FIG. 2, output nodes 215 and 225 couple to a transformer circuit 250 that in turn couples to a load circuit 240, represented as a load resistance $R_L$. In the embodiment of FIG. 2, transformer circuit 250 is implemented with multiple transformer-capacitor (C) networks. The transformer-C network comprising transformer $250_1$ and capacitors C11 and C12 effectively implements a quarter wave transmission line whose characteristic impedance is $R_L$. The transformer-C network comprising transformer $250_2$ and capacitors C21, C22, C23 and C24 effectively implements an ideal transformer of 2:1 winding ratio. More specifically as shown, output nodes $215_{p,n}$ couple to a primary winding $252_1$. As illustrated, a center tap node 2511 couples to primary winding $252_1$. A secondary winding $254_1$ inductively couples to primary winding $252_1$ and in turn, couples to load circuit 240. As further shown, capacitors C11, C12 couple in parallel to the primary and secondary sides of transformer $250_1$.

In turn, transformer $250_2$ may be configured to have a transformer ratio of 2:1. More specifically as shown, output nodes $225_{p,n}$ couple to a primary winding $252_2$. As illustrated, a center tap node $251_2$ couples to primary winding $252_2$. A secondary winding $254_2$ inductively couples to primary winding $252_2$ and in turn, couples to load circuit 240. As further shown, capacitors C21, C22 couple in parallel to the primary and secondary sides of transformer $250_2$. In addition capacitors C23, C24 couple in series to load circuit 240. Although shown at this high level in the embodiment of FIG. 2, many variations and alternatives are possible.

Figure 3:
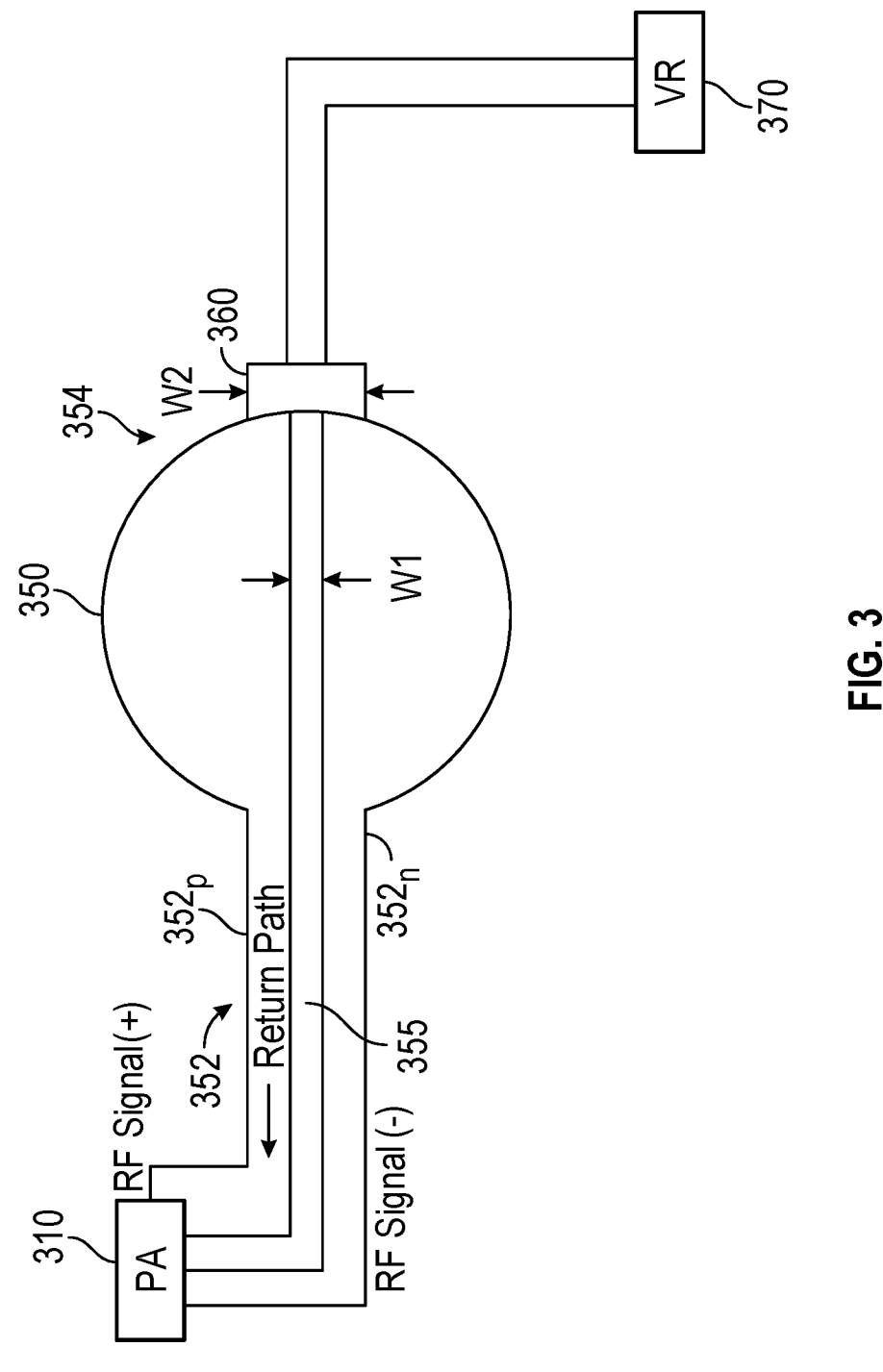
FIG. 3 is a top view of a layout of a portion of a semiconductor die in accordance with an embodiment.

Referring now to FIG. 3, shown is a top view of a layout of a portion of a semiconductor die in accordance with an embodiment. In FIG. 3, a layout 300 of a semiconductor die having a Doherty power amplifier is shown. As illustrated, a PA 310 is located at a first portion of the die. In an example, PA 310 may be a main PA having a differential output that couples to a primary winding 350 having a proximal portion (generally 352) and a distal portion (generally 354). Conductors $352_{p,n}$ carry high frequency currents that physically originate from PA 310 and return to it in the shortest possible path, via conductor 355. With this arrangement, the return path is kept short in order to minimize spurious inductance (and therefore) impedance in the signal path of these currents. Also, conductors $352_{p,n}$ carry high DC currents. In the absence of trace 360, the width of conductor 355 might be too wide to carry the high DC currents and meet the electromigration requirements of metal traces.

As conductor 355 passes through the center of primary winding 350, generally a region of high magnetic field, the presence of wide metal is a source of additional losses that degrades the efficiency of the power amplifier. But by having distal trace 360 for the DC currents, proximal trace 355 can be minimized in width while still maintaining a short return path for high frequency currents back to PA 310. A narrower width of conductor 355 significantly reduces the electromagnetic losses in primary winding 350 and helps achieve good efficiency performance of PA 310.

Still referring to FIG. 3, DC conductor 360 is coupled as a center tap to an external central portion of distal portion 354. As seen, DC conductor 360 further couples to a voltage regulator 370, which provides a supply voltage to the center tap. In one or more embodiments, this supply voltage may be at half the supply voltage level provided to the main and auxiliary PAs. Note that while not drawn to scale, the width of conductor 355 (represented as w1) may be substantially smaller than the width of conductor 360 (represented as w2). As an example, in one embodiment a ratio of width w1 to width w2 may be between approximately 3:20 (e.g., 3 micrometers and 20 micrometers). Although not shown in FIG. 3 for ease of illustration, understand that a secondary winding may be adapted about primary winding 350.

Figure 4:
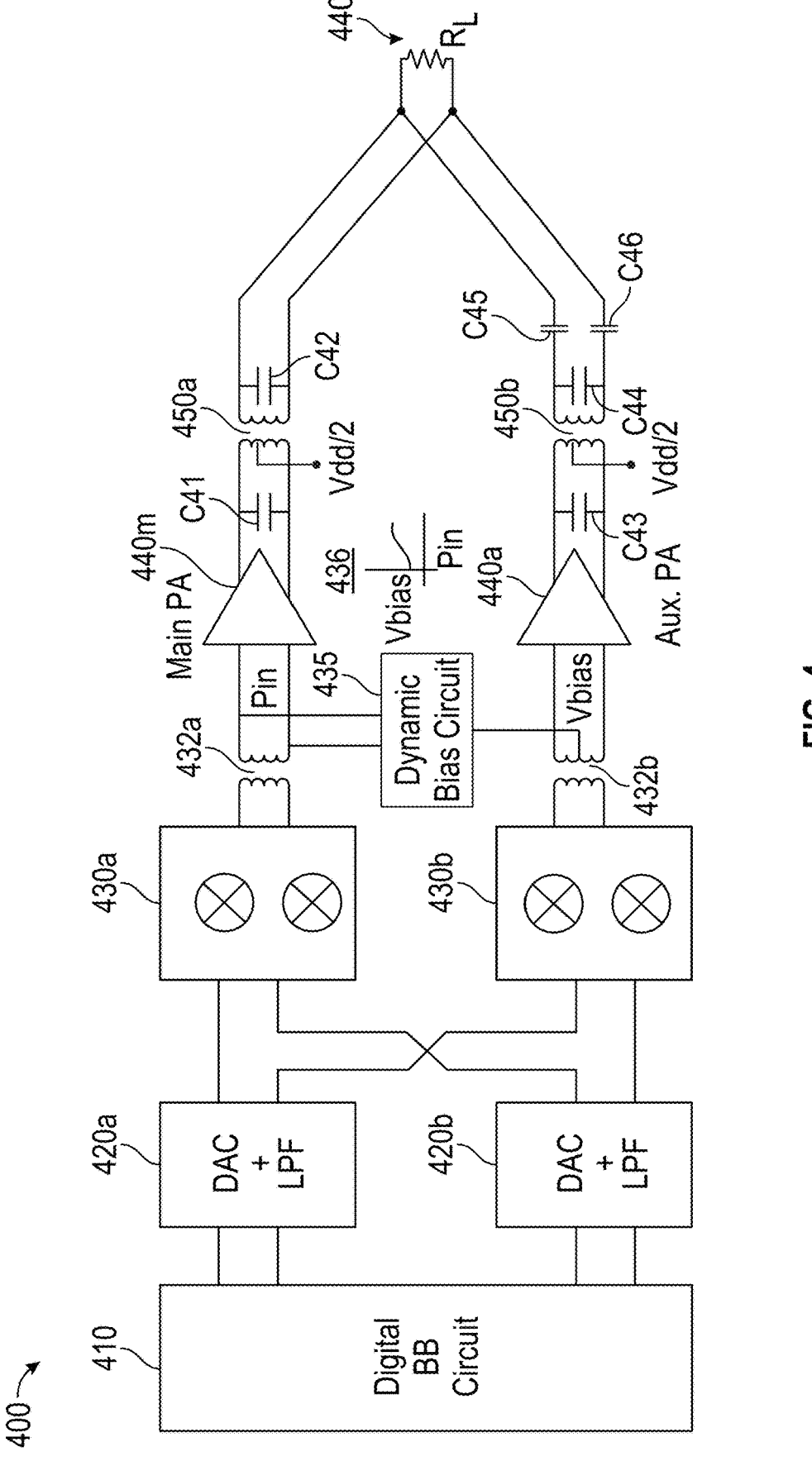
FIG. 4 is a block diagram of a transmitter including a Doherty power amplifier in accordance with another embodiment.

Referring now to FIG. 4, shown is a block diagram of a transmitter including a Doherty power amplifier in accordance with another embodiment. As illustrated, transmitter 400 includes a digital baseband circuit 410. Baseband circuit 410 may be configured to process incoming data and provide it to additional transmitter signal processing path circuitry, including conversion and filtering circuitry 420 having dual quadrature paths including digital-to-analog converters (DACs) and low pass filters (LPFs) ($420_{a,b}$). In turn, resulting quadrature digital signals are provided to complex mixers $430_{a,b}$, which upconvert the digital signals to radio frequency (RF) signals.

The resulting quadrature differential RF signals are provided to main and auxiliary paths, namely to a main PA $440_M$ and an auxiliary PA $440_A$. via corresponding transformers $432_{a,b}$. Transformers 432 may be optional, in some implementations. In one or more embodiments, main PA $440_M$ may be configured for Class AB operation, while auxiliary PA $440_A$ may be configured to for Class C operation. After amplification in the Doherty PA formed of main PA $440_M$ and auxiliary PA $440_A$, the resulting amplified RF signals are passed through a transformer circuit 450 and provided to a load circuit 460. As illustrated, transformer circuit 450 may be implemented with separate transformer-C networks (first transformer $450_a$ and corresponding capacitors C41, C42 (which implement a matched quarter wave transmission line), and second transformer $450_b$ and corresponding capacitors C43, C44, C45 and C46).

As further shown in FIG. 4 an optional dynamic bias circuit 435 may be coupled to an output of complex mixer 430. In one or more embodiments, dynamic bias circuit 435 may be configured, based at least in part on the RF signal levels, to generate signal dependent bias voltages that are provided to bias MOSFETs present in auxiliary PA $440_A$. In FIG. 4, dynamic bias circuit 435 provides such voltages to a secondary of transformer $432_b$. in another implementation, the voltage signals may be AC coupled (through capacitors) to the MOSFETs of auxiliary PA $440_A$. Dynamic bias circuit 435 generates a voltage, Vbias, based on the input signal level of main PA $440_M$ as shown by the curve 436 in FIG. 4, such that the output current of auxiliary PA $440_A$ matches the current profile shown in FIG. 1C. Understand while shown at this high level in the embodiment of FIG. 4, many variations and alternatives are possible.

Figure 5:
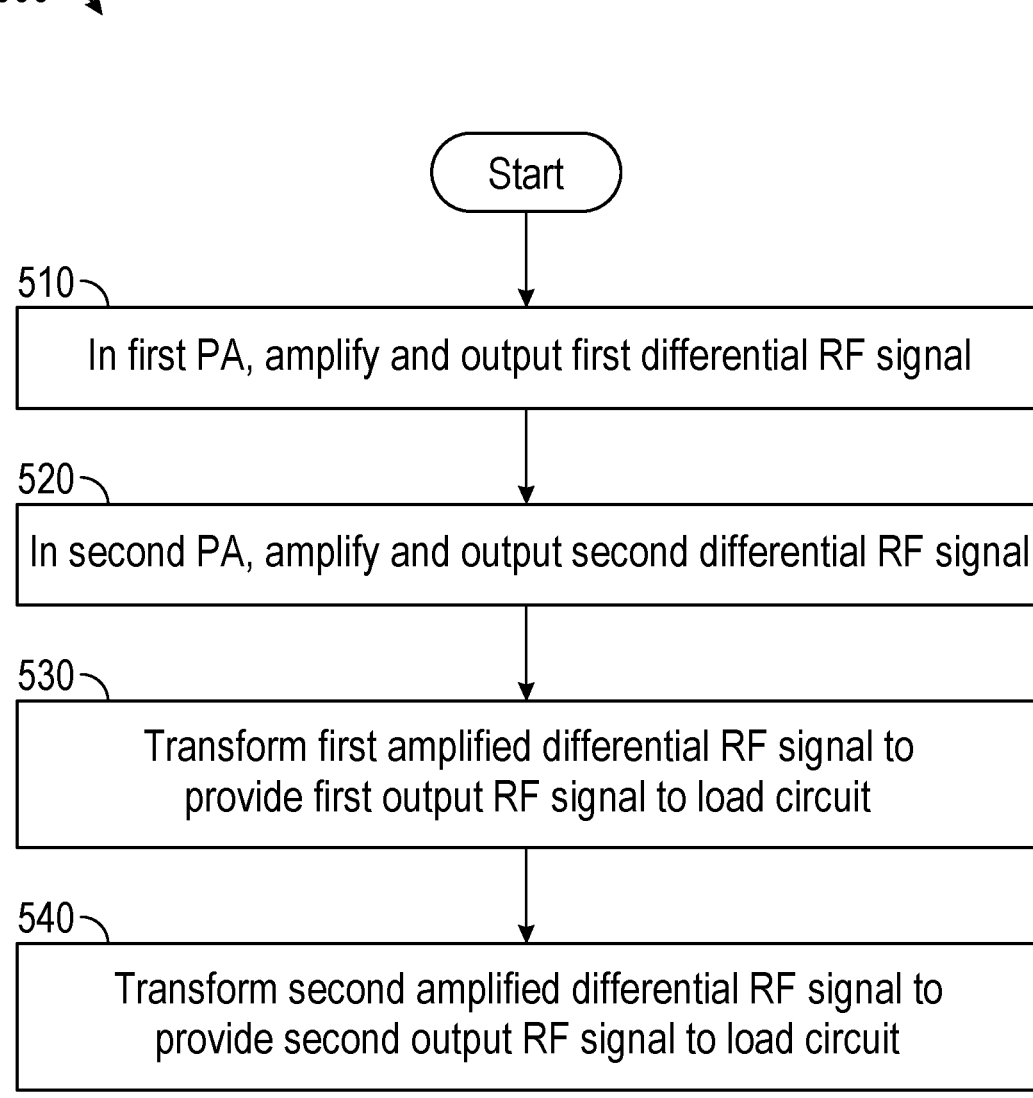
FIG. 5 is a flow diagram of a method in accordance with an embodiment.

Referring now to FIG. 5, shown is a flow diagram of a method in accordance with an embodiment. FIG. 5 is a method for operating a transmitter including a Doherty PA having a matched transmission line. As shown, method 500 begins by amplifying, in a first PA, a first differential RF signal and outputting a first amplified differential RF signal (block 510). At block 520, which may occur concurrently with block 510, in a second PA, a second differential RF signal is amplified and output as a second amplified differential RF signal.

Still referring to FIG. 5, next at block 530, in a first transformer coupled to the first PA, the first amplified differential RF signal is transformed to provide a first output RF signal to a load circuit. As discussed above, e.g., with regard to FIG. 2, this first transformer may include a matched transmission line that retains a 1:1 ratio of input impedance to load impedance over a wideband (e.g., covering both 5G and 6G bandwidths). At block 540, in a second transformer coupled to the second PA, the second amplified differential RF signal is transformed to provide a second output RF signal to the load circuit. With this operation, a Doherty PA is realized that operates with high efficiency over a wideband of operation.

Figure 6:
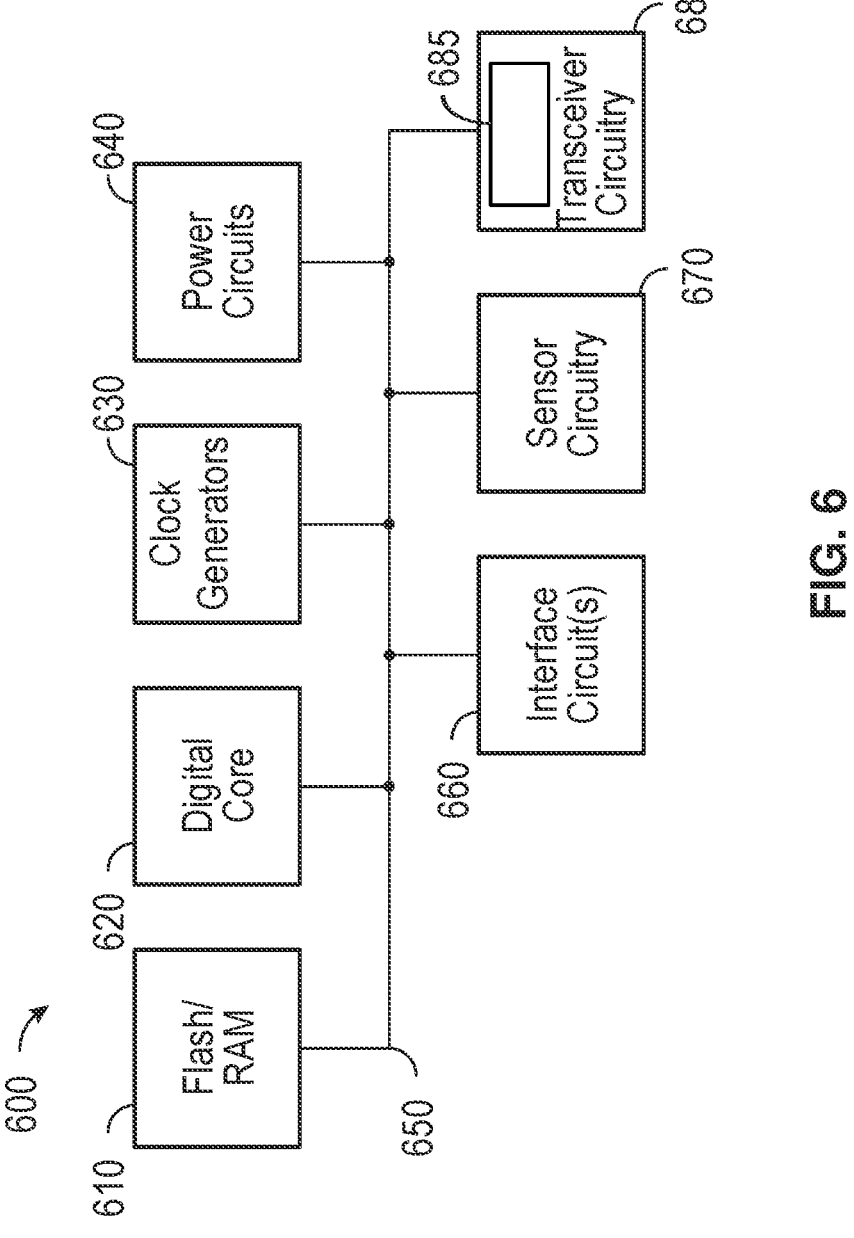
FIG. 6 is a block diagram of a representative integrated circuit in accordance with an embodiment.

Embodiments can be implemented in many different environments. Referring now to FIG. 6, shown is a block diagram of a representative integrated circuit 600 that includes a wideband Doherty PA as described herein. In the embodiment shown in FIG. 6, integrated circuit 600 may be, e.g., a microcontroller having a wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth. In embodiments, integrated circuit 600 may be particularly adapted for use in an IoT device that operates over 5G or 6G networks, e.g., according to one or more Wi-Fi protocols, e.g., Wi-Fi 6, 6E and/or 7.

In the embodiment shown, integrated circuit 600 includes a memory system 610 which in an embodiment may include a non-volatile memory such as a flash memory and volatile storage, such as RAM. In an embodiment, this non-volatile memory may be implemented as a non-transitory storage medium that can store instructions and data.

Memory system 610 couples via a bus 650 to a digital core 620, which may include one or more cores and/or microcontrollers that act as a main processing unit of the integrated circuit. In turn, digital core 620 may couple to clock generators 630 which may provide one or more phase locked loops or other clock generator circuitry to generate various clocks for use by circuitry of the IC.

As further illustrated, IC 600 further includes power circuitry 640, which may include one or more voltage regulators. Additional circuitry may optionally be present depending on particular implementation to provide various functionality and interaction with external devices. Such circuitry may include interface circuitry 660 which may provide interface with various off-chip devices, sensor circuitry 670 which may include various on-chip sensors including digital and analog sensors to sense desired signals, such as for a metering application or so forth.

In addition as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 680 includes a Doherty PA 685 having associated transformers to effect a matched quarter wave transmission line as described herein. Understand while shown with this high level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 7:
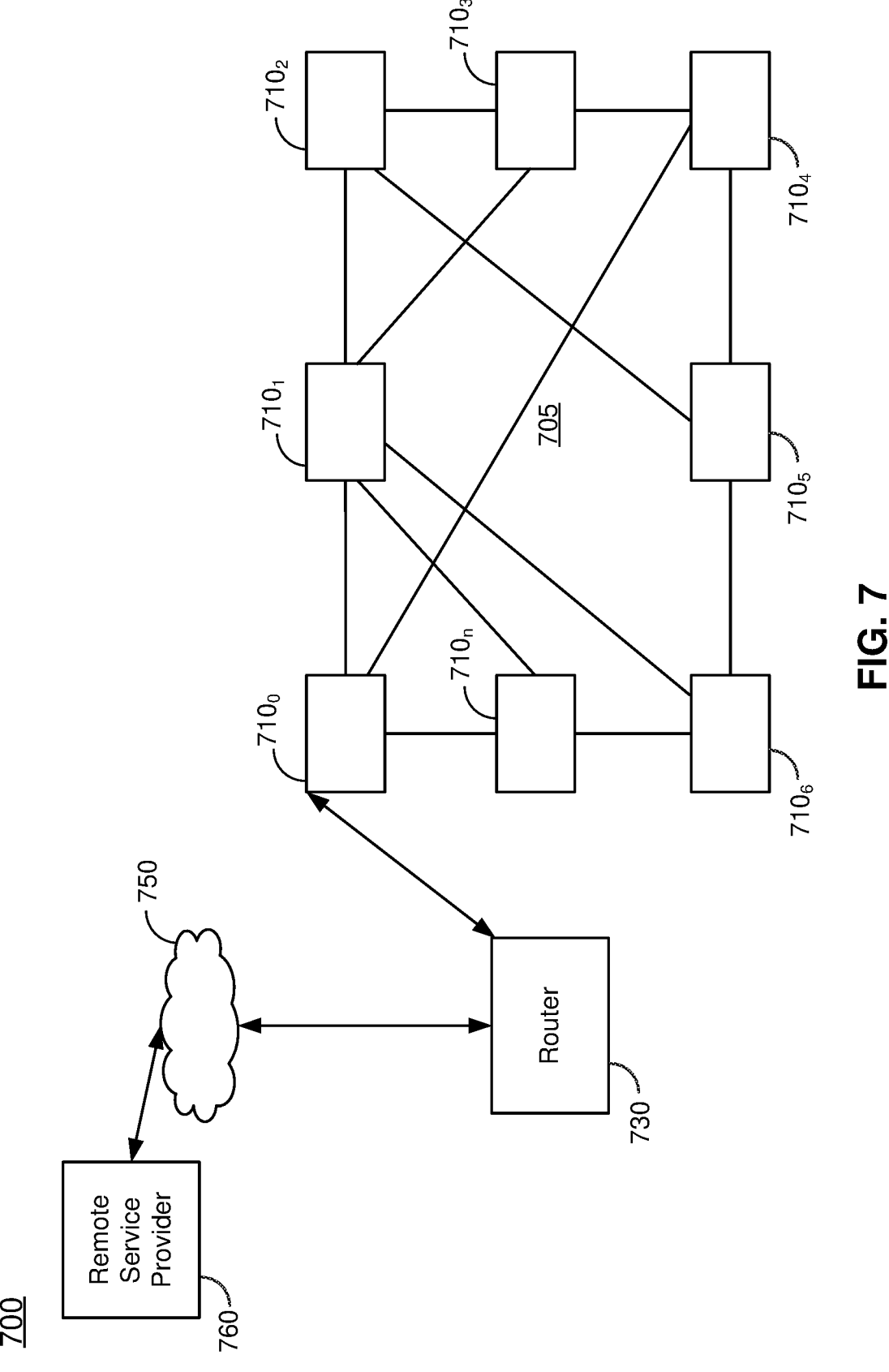
FIG. 7 is a block diagram of a system in accordance with an embodiment.

Referring now to FIG. 7, shown is a high level diagram of a network in accordance with an embodiment. As shown in FIG. 7, a network 700 includes a variety of devices, including smart devices such as IoT devices, routers and remote service providers. In the embodiment of FIG. 7, a mesh network 705 may be present, e.g., in a building having multiple IoT devices $710_{0-n}$. Such IoT devices may include transceivers having wideband Doherty PA circuitry as described herein. As shown, at least one IoT device 710 couples to a router 730 that in turn communicates with a remote service provider 760 via a wide area network 750, e.g., the internet. In an embodiment, remote service provider 760 may be a backend server of a utility that handles communication with IoT devices 710. Understand while shown at this high level in the embodiment of FIG. 7, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a first power amplifier (PA) to receive a supply voltage, a first input radio frequency (RF) signal and output a first amplified RF signal;
   a second PA to receive the supply voltage, a second input RF signal and output a second amplified RF signal; and
   a transformer circuit coupled to an output of the first PA and an output of the second PA, wherein the transformer circuit is to provide, to a load circuit, an RF output signal comprising the first amplified RF signal and the second amplified RF signal, wherein the transformer circuit comprises:
   a first transformer-capacitor circuit comprising:
      a first primary winding coupled to the output of the first PA and a first secondary winding inductively coupled to the first primary winding to provide the first amplified RF signal to the load circuit, the first primary winding coupled to a first center tap node to receive half the supply voltage;
      a first capacitor coupled in parallel with the first primary winding; and
      a second capacitor coupled in parallel with the first secondary winding, wherein the first transformer-capacitor circuit, via the first primary winding, the first secondary winding, the first capacitor and the second capacitor, implements a transmission line having a characteristic impedance of the load circuit; and
   a second transformer-capacitor circuit comprising:
      a second primary winding coupled to the output of the second PA and a second secondary winding inductively coupled to the second primary winding to provide the second amplified RF signal to the load circuit, the second primary winding coupled to a second center tap node to receive half the supply voltage;

a third capacitor coupled in parallel with the second primary winding;

a fourth capacitor coupled in parallel with the second secondary winding;

a fifth capacitor coupled to the second secondary winding; and a sixth capacitor coupled to the second secondary winding.

2. A transmitter comprising:

a signal processing path comprising:

a digital baseband circuit to process data and output digital data;

a converter to convert the digital data to analog data;

at least one complex mixer to upconvert the analog data to quadrature radio frequency (RF) signals;

a first power amplifier (PA) to receive a supply voltage and coupled to the at least one complex mixer to receive a first quadrature RF signal and output a first amplified quadrature RF signal;

a second PA to receive the supply voltage and coupled to the at least one complex mixer to receive a second quadrature RF signal and output a second amplified quadrature RF signal; and a transformer circuit coupled to an output of the first PA and an output of the second PA, wherein the transformer circuit is to provide, to a load circuit, an RF output signal comprising the first amplified quadrature RF signal and the second amplified quadrature RF signal, wherein the transformer circuit comprises:

a first transformer-capacitor circuit comprising:

a first primary winding coupled to the output of the first PA and a first secondary winding inductively coupled to the first primary winding to provide the first amplified quadrature RF signal to the load circuit;

a first capacitor coupled in parallel with the first primary winding; and a second capacitor coupled in parallel with the first secondary winding, wherein the first transformer-capacitor circuit, via the first primary winding, the first secondary winding, the first capacitor and the second capacitor, implements a transmission line having a characteristic impedance of the load circuit; and a second transformer-capacitor circuit comprising:

a second primary winding coupled to the output of the second PA and a second secondary winding inductively coupled to the second primary winding to provide the second amplified quadrature RF signal to the load circuit;

a third capacitor coupled in parallel with the second primary winding;

a fourth capacitor coupled in parallel with the second secondary winding;

a fifth capacitor coupled to the second secondary winding; and a sixth capacitor coupled to the second secondary winding.

3. The apparatus of claim 1, wherein the transformer circuit comprises at least one planar transformer.

4. The apparatus of claim 3, wherein the at least one planar transformer comprises:

a first winding having a proximal portion and a distal portion, the proximal portion adjacent an opening;

a first conductor coupled to an interior of the proximal portion and to provide the first amplified RF signal; and a second conductor coupled to an exterior of the proximal portion and to provide the supply voltage.

5. The apparatus of claim 4, wherein the first conductor has a first width and the second conductor has a second width, the second width greater than the first width.

6. The apparatus of claim 4, wherein the supply voltage provided via the second conductor is less than a first supply voltage provided to the first PA.

7. The apparatus of claim 1, wherein the first PA comprises a main PA and the second PA comprises an auxiliary PA.

8. The apparatus of claim 7, wherein the main PA is to operate as a Class AB device and the auxiliary PA is to operate as a Class C device.

9. The apparatus of claim 1, wherein the transformer circuit comprises a 2:1 ratio between a primary side and a secondary side, the transformer circuit comprising a quarter wavelength transmission line, the quarter wavelength transmission line comprising a matched transmission line.

10. The apparatus of claim 9, wherein the first PA and the second PA are to operate over a wideband comprising at least 2.0 gigahertz.

11. The apparatus of claim 9, wherein the quarter wavelength transmission line has a 1× impedance transformation in a backoff region.

12. The apparatus of claim 1, wherein:

the first PA is to output a first output current that varies based on an input voltage according to a first slope; and the second PA is to output a second output current that varies based on the input voltage according to a second slope, the second slope different than the first slope.

13. The apparatus of claim 12, wherein, via the transformer circuit, the load circuit is to receive the first output current and a transformed second output current that varies based on the input voltage according to the first slope and the second slope respectively.

14. The apparatus of claim 1, further comprising a dynamic bias circuit to provide a dynamic bias voltage to the second PA, based at least in part on an output voltage of the first PA.

15. The apparatus of claim 1, further comprising a scaling circuit to scale an input to at least one of the first PA or the second PA.

16. A method comprising:

amplifying, in a first power amplifier (PA) that receives a supply voltage, a first differential radio frequency (RF) signal and outputting a first amplified differential RF signal;

amplifying, in a second PA that receives the supply voltage, a second differential RF signal and outputting a second amplified differential RF signal;

transforming, in a first transformer coupled to the first PA, the first amplified differential RF signal to provide a first output RF signal to a load circuit, the first transformer comprising a matched transmission line and a first primary winding coupled to a first center tap node to receive half the supply voltage, the first primary winding coupled to an output of the first PA and a first secondary winding inductively coupled to the first primary winding to provide the first output RF signal to the load circuit, wherein a first capacitor is coupled in parallel with the first primary winding and a second capacitor is coupled in parallel with the first secondary winding to form the matched transmission line; and transforming, in a second transformer coupled to the second PA, the second amplified differential RF signal to provide a second output RF signal to the load circuit, the second transformer comprising a second primary winding coupled to a second center tap node to receive half the supply voltage, the second primary winding coupled to an output of the second PA and a second secondary winding inductively coupled to the second primary winding to provide the second output RF signal to the load circuit, wherein a third capacitor is coupled in parallel with the second primary winding, a fourth capacitor is coupled in parallel with the second secondary winding, a fifth capacitor is coupled between the second secondary winding and the load circuit, and a sixth capacitor is coupled between the second secondary winding and the load circuit.

17. The method of claim 16, further comprising dynamically biasing the second PA based at least in part on the first differential RF signal.

18. The method of claim 16, further comprising amplifying, in the first PA and the second PA, a plurality of differential RF signals over a bandwidth of at least 2.0 gigahertz.

<div align="center">* * * * *</div>